(12) United States Patent
Barson et al.

(10) Patent No.: US 8,169,378 B2
(45) Date of Patent: May 1, 2012

(54) SYSTEM AND METHOD FOR STABILIZING AN ELECTRONIC ARRAY

(75) Inventors: George F. Barson, Plano, TX (US); Trae M. Blain, Plano, TX (US)

(73) Assignee: Raytheon Company, Waltham, MA (US)

( * ) Notice: Subject to any disclaimer, the term of this patent is extended or adjusted under 35 U.S.C. 154(b) by 548 days.

(21) Appl. No.: 12/028,265

(22) Filed: Feb. 8, 2008

(65) Prior Publication Data

US 2009/0201217 A1    Aug. 13, 2009

(51) Int. Cl.
*H01Q 13/10* (2006.01)
(52) U.S. Cl. .................. 343/770; 343/795; 343/879
(58) Field of Classification Search .................. 343/767, 343/770, 795, 810, 879, 893, 878
See application file for complete search history.

(56) References Cited

U.S. PATENT DOCUMENTS 4,782,346 A * 11/1988 Sharma ........................ 343/795
5,110,298 A    5/1992 Dorinski et al.
5,579,020 A * 11/1996 Kinsey .......................... 343/776
6,822,617 B1   11/2004 Mather et al.
6,864,851 B2 *  3/2005 McGrath ...................... 343/776
2004/0112827 A1 * 6/2004 May et al. ................ 210/497.01

FOREIGN PATENT DOCUMENTS

FR           2 693 340 A1    1/1994

OTHER PUBLICATIONS

Notification of Transmittal of the International Search Report and the Written Opinion of the International Searching Authority or the Declaration, International Application No. PCT/US2009/033002, Filing Date Apr. 2, 2009, 10 pages, Oct. 15, 2009.

* cited by examiner

*Primary Examiner* — HoangAnh T Le
(74) *Attorney, Agent, or Firm* — Daly, Crowley, Mofford & Durkee, LLP

(57) ABSTRACT

A system for stabilizing an electronic array includes at least one component having a notch and at least one stabilizing bar. The stabilizing bar comprises a first pair of contact points. The at least one stabilizing bar is positioned upon the at least one component such that the first pair of points deform against the at least one component below the notch.

19 Claims, 4 Drawing Sheets

SYSTEM AND METHOD FOR STABILIZING AN ELECTRONIC ARRAY

GOVERNMENT FUNDING

This invention was made with Government support under contract W56 HZV-05-C-0724 awarded by the U.S. Army Tank-Automotive and Armaments Command (TACOM). The Government has certain rights in this invention.

TECHNICAL FIELD

This invention relates generally to stabilization systems and more particularly to a system and method for stabilizing an electronic array.

BACKGROUND

It is advantageous for arrays, such as radar arrays, to remain stable—impervious to disturbances caused by, as an example, vibrations. Arrays such as radar arrays are usually placed in a housing. The housing containing the array may be placed in a stationary location, such as a building. It may also be placed on a vehicle, such as an armored truck or a ship. While in any of these locations, the housing may be subject to physical disturbances, such as vibrations emanating from the operation of a vehicle on which the housing is placed. Such disturbances hinder the performance of the array, especially radar arrays.

A possible solution for stabilizing the array would be to use a comb strip, precisely cut, so that the grooves of the comb strip fit snugly across the elements of the array. However, the precision required to create such a comb strip causes increased costs in manufacturing. Further, small defects in the manufacture of the array or the comb strip leads to a reduced capacity to stabilize.

Another possible solution would be to combine the comb strip described above with epoxy to further stabilize the array. Epoxy would be placed within the gaps between the comb strip and the array elements. However, this leads to an increase of cost in manufacturing because epoxy must be manually added in every point where the bar and the elements of the array are connected. The comb strip-epoxy combination also leads to increased complexity in servicing the array since the epoxy must be cleared away before any servicing may occur.

SUMMARY

A system for stabilizing an electronic array comprises at least one component having a notch. The system also comprises at least one stabilizing bar comprising a first pair of points. The at least one stabilizing bar is positioned upon the at least one component such that the first pair of points deform against the at least one component below the notch.

The system may include forming the first pair of points by drilling at least one hole into the at least one stabilizing bar. The electronic array of the system may be a radar array. In the system, the at least one stabilizing bar may comprise G-10 laminate. Further, the at least one stabilizing bar of the system may comprise a second pair of points that deform against the at least one component below the notch.

A method for stabilizing an electronic array, comprises providing at least one component having a notch. Further, the method comprises positioning at least one stabilizing bar, which comprises a first pair of points, upon the at least one component such that the first pair of points deform against the at least one component below the notch.

Depending on the specific features implemented, particular embodiments may exhibit some, none, or all of the following technical advantages. Various embodiments may facilitate access to the electronic array or components for servicing. Certain embodiments may also allow for inexpensive production of the stabilizing bar. Other technical advantages will be readily apparent to one skilled in the art from the following figures, description and claims.

BRIEF DESCRIPTION OF THE DRAWINGS

Reference is now made to the following description taken in conjunction with the accompanying drawings, wherein like reference numbers represent like parts, and which.

DETAILED DESCRIPTION

Particular embodiments are best understood by referring to FIGS. 1 through 9 of the drawings, like numerals being used for like and corresponding parts of the various drawings.

Figure 1:
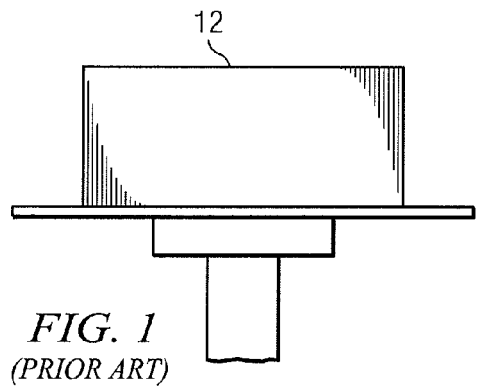
FIG. 1 illustrates a typical housing.

FIG. 1 illustrates a typical housing 12. Housing 12 may be composed of a plurality of materials, including, but not limited to, ceramics, plastics, and composites. In one example, housing 12 may be placed on a vehicle, such as a tank or ship. In another example, housing 12 may be placed on a building. In any of these or other examples, housing 12 may be subjected to forces which disturb housing 12. Housing 12 may also include structures configured to house electronic components. In other examples, housing 12 may be a radome or may be placed in a radome.

Figure 2:
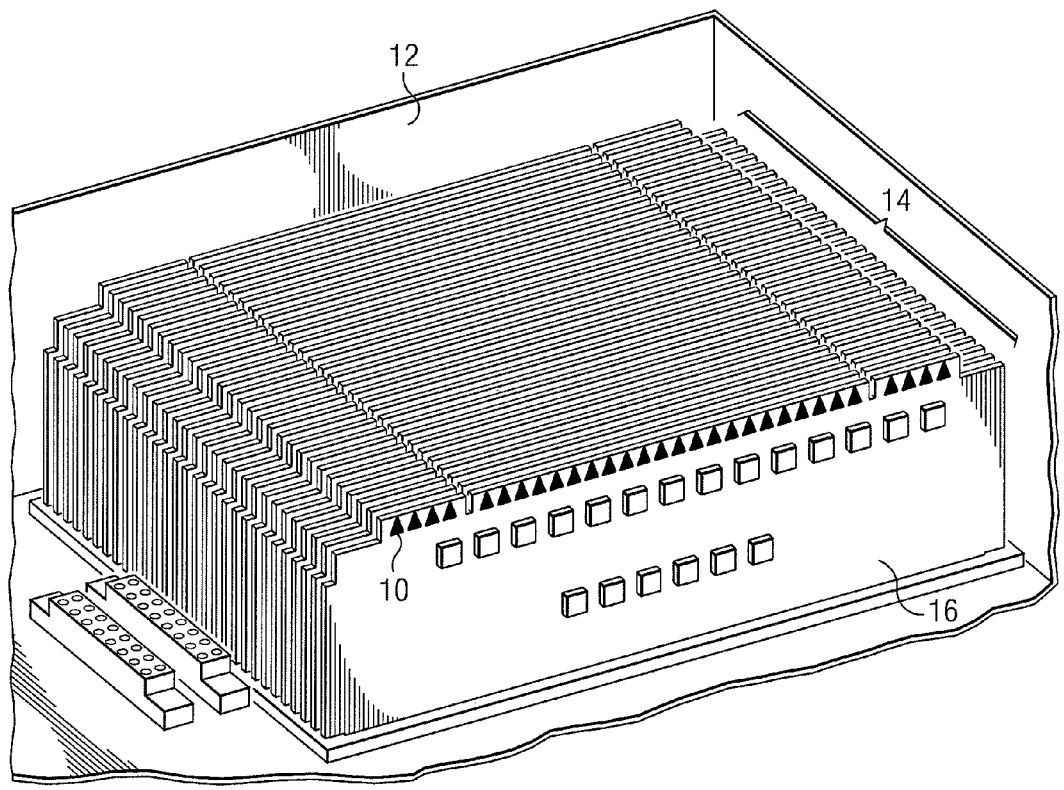
FIG. 2 illustrates a conventional example of the contents of the housing of FIG. 1.

FIG. 2 illustrates a conventional example of the contents of housing 12. Housing 12 includes radiating element assemblies 16 which comprise radiating elements 10. Radar array 14 comprises an arrangement of radiating element assemblies 16. In one example, radar array 14 is a high frequency phased array radar with radiating element assemblies 16 arranged in a 0.175 inch square grid. Radar array 14 may, in other examples, be a phased array radar used for AM radio transmission, a marine radar array, active phased radar array, or other radar array configurations. Further, radar array 14 may also be any other array that benefits from stabilization, such as an array of computer components.

In one example, housing 12 may be situated on a vehicle, such as a ship or armored truck. As the vehicle moves, vibrations and other physical disturbances may affect radar array 14. Such disturbances may hinder the performance of radar array 14 as radiating elements 16 are displaced with respect to each other and as a whole. In one example, where radar array 14 is a high frequency phase array radar, displacements of more than 1/1000th of an inch may cause depreciation in the quality of the radar array.

Figure 3:
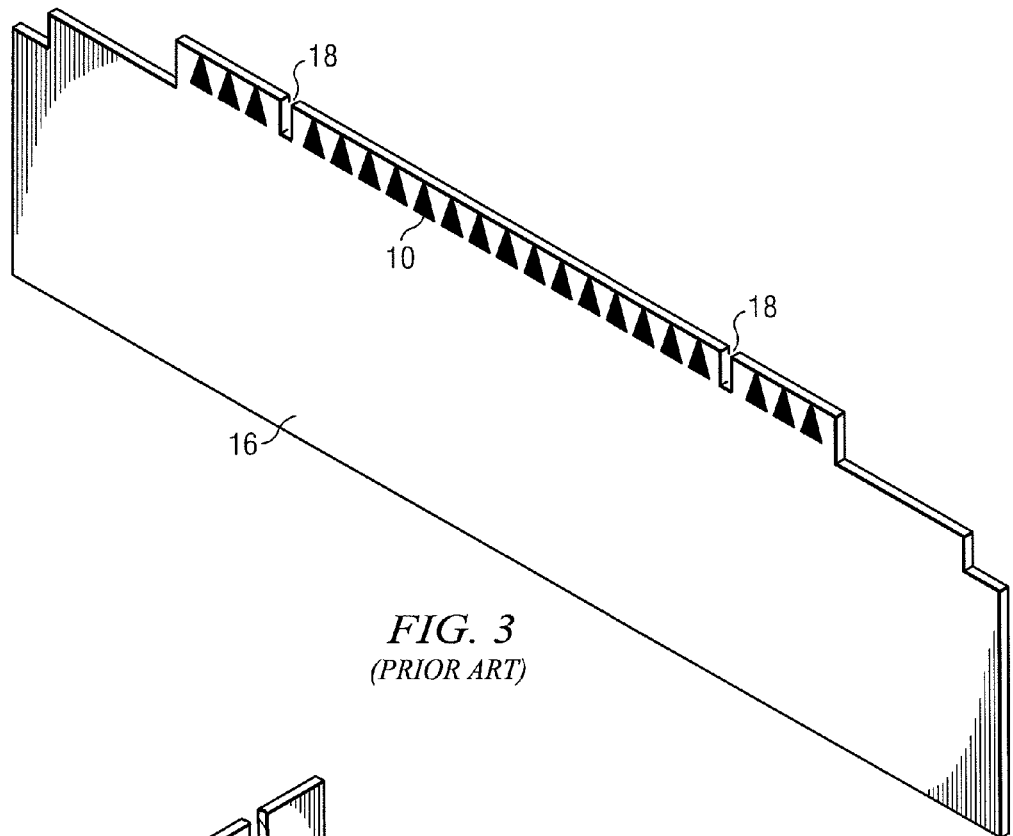
FIG. 3 illustrates a typical radiating element assembly.

FIG. 3 illustrates a typical radiating element assembly 16. In one example, radiating element assembly 16 comprises a printed wiring board (PWB). In another example, radiating element assembly 16 is a PWB with a thickness of 0.039 inches with a tolerance of +0.003 inches and −0.003 inches. In another example, radiating element assembly 16 is a Transmit Receive Integrated Microwave Module (TRIMM). Notches 18 may be created by cutting into radiating element assembly 16. They may also be created when radiating element assembly 16 is fabricated. The size of notches 18 may vary according to the properties of radar array 14 and the configuration of radiating element assembly 16. In one example where radar array 14 is a high frequency phased radar array, notch 18 may be 0.02 inches wide. The placement of notches 18 may also vary; for example, in one case notch 18 may be formed on the edges of radiating element assembly 16 perpendicular to the plane upon which radiating element assembly 16 sits.

Figure 4:
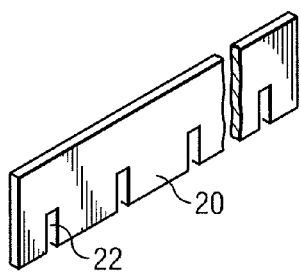
FIG. 4 shows a conventional comb strip.

FIG. 4 shows a conventional comb strip 20 for providing stabilization to a radar array. Comb strip 20 contains grooves 22. Comb strip 20 may be made of ceramic, composite, or other suitable materials. Groove 22 is rectangular in shape, and its width is dependent upon the thickness of radiating element assembly 16, as described below.

Figure 5A:
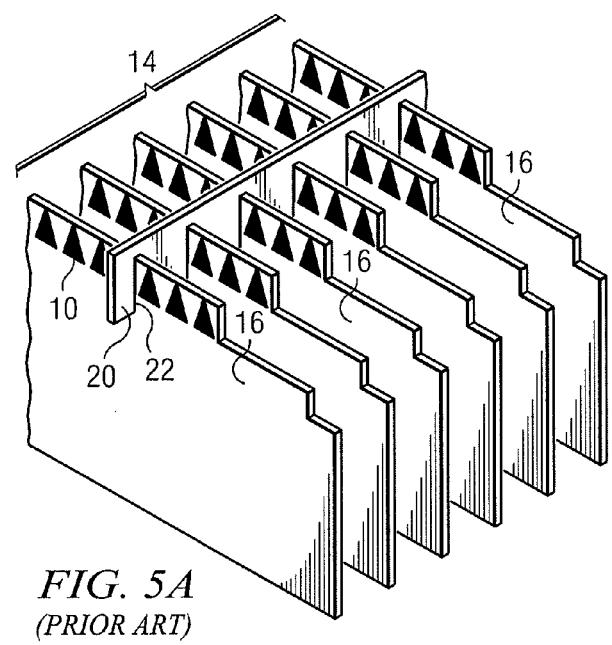
FIG. 5A shows one manner of placing a comb strip on a radar array.

FIG. 5A shows one manner of placing a comb strip on a radar array. Comb strip 20 is placed across radar array 14 such that grooves 22 are positioned into notches 18. By positioning comb strip 20 across radar array 14, individual displacements of radiating element assemblies 16 are reduced because in order for radiating element assemblies 16 to be displaced, comb strip 20 would also have to be displaced. However, it is difficult to displace comb strip 20 since it is rigid and placed across radar array 14. Comb strip 20 may be secured by creating groove 22 such that it corresponds with the thickness of radiating element assembly 16; such a calibration will secure comb strip 20 through the pressure of physical contact between comb strip 20 and radiating element assemblies 16. In one example, both the thickness of radiating element assembly 16 and the width of grooves 22 are 0.039 inches. In this example, radiating elements 16 are configured into radar array 14, being secured at their bottom edges. Then, comb strip 20 is placed on top of radar array 14 in a manner that aligns notches 18 and grooves 22. Further, comb strip 20 is pressed onto radar array 14 by applying physical pressure such that grooves 22 slide into notches 18. In other embodiments, comb strip 20 may also be slid into notches 18 that are placed on the side edges of radiating element assemblies 16 rather than on their top edge.

Figure 5B:
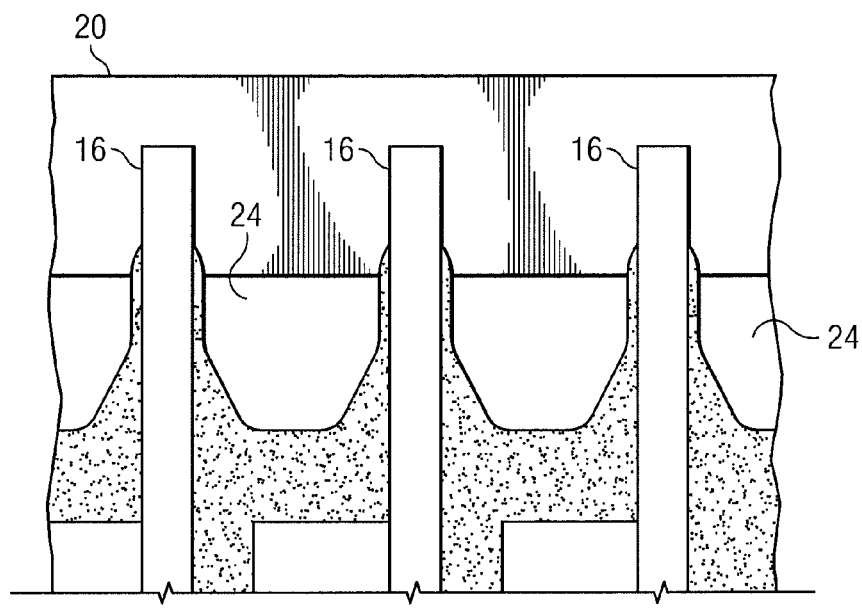
FIG. 5B illustrates a side view of the comb strip placement upon a radar array illustrated in FIG. 5A.

FIG. 5B illustrates a side view of the comb strip placement on a radar array illustrated in FIG. 5A. Epoxy 24 is used to further stabilize comb strip 20 on radar array 14. Epoxy 24 is placed in the gaps formed between comb strip 20 and radiating element assemblies 16. Epoxy 24 is applied after comb strip 20 is placed on radar array 14. However, configurations like those described in FIG. 5B may not be ideal. First, manufacturing comb strip 20 may be very expensive. In situations where displacement tolerances are very strict, such as a tolerance of 1/1000th of an inch, grooves 22 must be precisely cut to meet expectations. Further, mass production causes variations in the widths and thicknesses of both grooves 22 and radiating element assemblies 16; variations in these widths and thicknesses may lead to comb strip 20 not fitting properly.

As an example only, consider a situation in which radar array 14 consists of eight radiating element assemblies 16. Further, consider that each radiating element assembly 16 contains two notches 18 as well as two combs 20 used to stabilize radar array 14. In this example, there are a total of sixteen grooves 22. A variation present in the width of any of the sixteen grooves 22 or in the thickness of any of the eight radiating element assemblies 16 necessitates replacing either comb strip 20 or the variant radiating element assembly 16. This example highlights another problem with the configuration depicted by FIG. 5B. In this example, at each of the sixteen assembly-groove pairs, epoxy 24 must be applied; this is a labor-intensive and expensive process. Yet another problem present involves servicing radar array 14. The presence of epoxy 24, which is in contact with radiating element assembly 16, makes it difficult to access radiating element assemblies 16 for servicing.

As an example only, consider a situation in which one of the radiating element assemblies 16 needed to be repaired. In order to access radiating element assembly 16, comb strip 20 must be removed. In a configuration without epoxy 24, comb strip 20 may be lifted off of radiating element assemblies 16. However, this process may alter the characteristics of radiating element assembly 16 or grooves 22. As a result, comb strip 20 may need to be replaced, which is expensive due to the precision with which comb strip 20 must be cut as described above.

As another example, consider a configuration in which comb strip 20 is combined with epoxy 24. In order to access a radiating element assembly 16, comb strip 20 must be removed. But, before that can take place, epoxy 24 must be removed from every interface between comb strip 20 and radiating element assemblies 16; removing epoxy 24 is both time-intensive and expensive. Further, after the servicing of radiating element assembly 16, comb strip 20 must be placed back onto radar array 14 and epoxy 24 must be reapplied to every interface between comb strip 20 and radiating element assemblies 16. If comb strip 20 was damaged during the removal of epoxy 24, a new comb strip 20 must be used instead.

Figure 6:
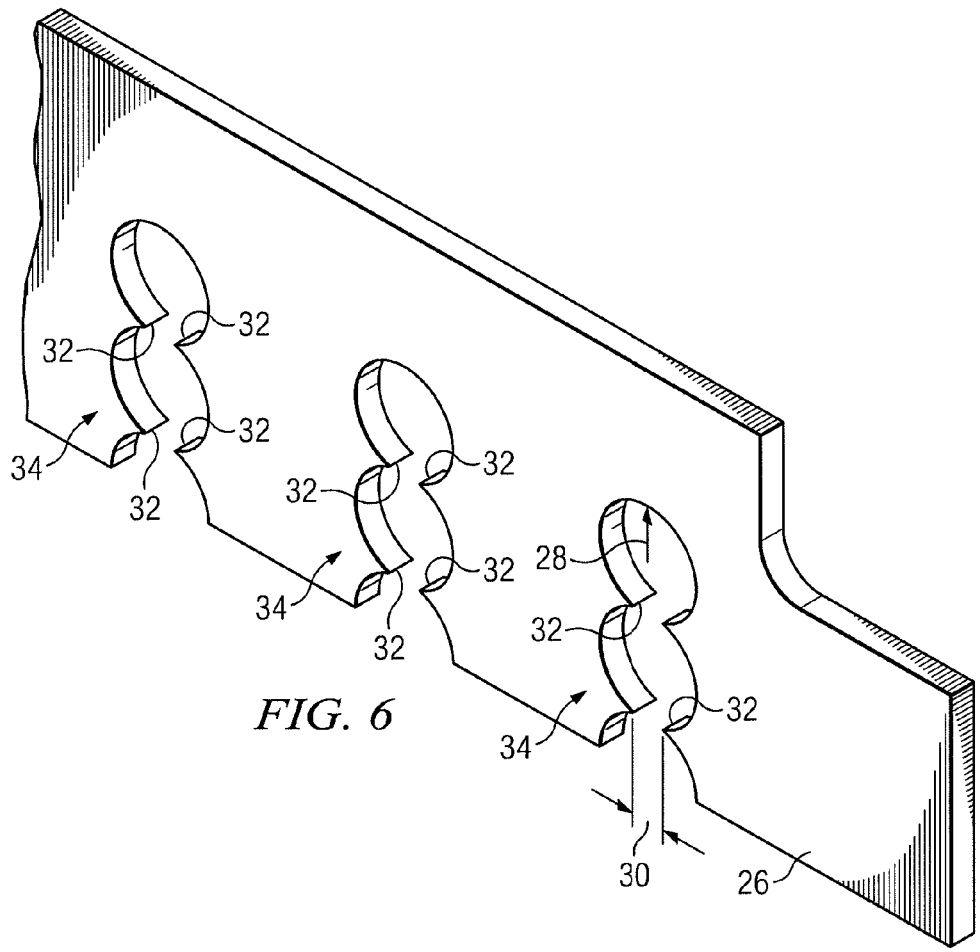
FIG. 6 illustrates a stabilization bar used in a system for stabilizing an electronic array, in accordance with a particular embodiment.

FIG. 6 depicts a stabilization bar, used in a system for stabilizing an electronic array, in accordance with a particular embodiment. Stabilization bar 26 comprises three stabilizing portions 34. Stabilizing portions 34 comprise any number of contact points 32. Gap 30 represents the distance between contact points 32. In this embodiment, stabilization portions 34 are created by drilling overlapping circular holes of a radius 28 into stabilization bar 26. In one embodiment, the circular holes have a diameter of 0.068 inches with a standard drill bit tolerance of +0.004 inches and −0.001 inches. As described further below, gap 30 and radius 28 may be determined based on properties of a radiating element assembly 16. Other embodiments may include a stabilization bar having stabilization portions forming any suitable shape or configuration to provide contact points. For example, in some embodiments stabilizing portions may be non-circular. Stabilization bar 26 may be made of a variety of materials, including, but not limited to, plastics or G-10 laminate. At least one advantage present in this embodiment is that stabilization bar 26 is inexpensive to produce. Unlike comb strip 20, where precise rectangular cuts were made, only holes need to be drilled to form stabilization bar 26. Drilling holes is less expensive in terms of both labor and time than creating precise rectangular cuts.

Figure 7:
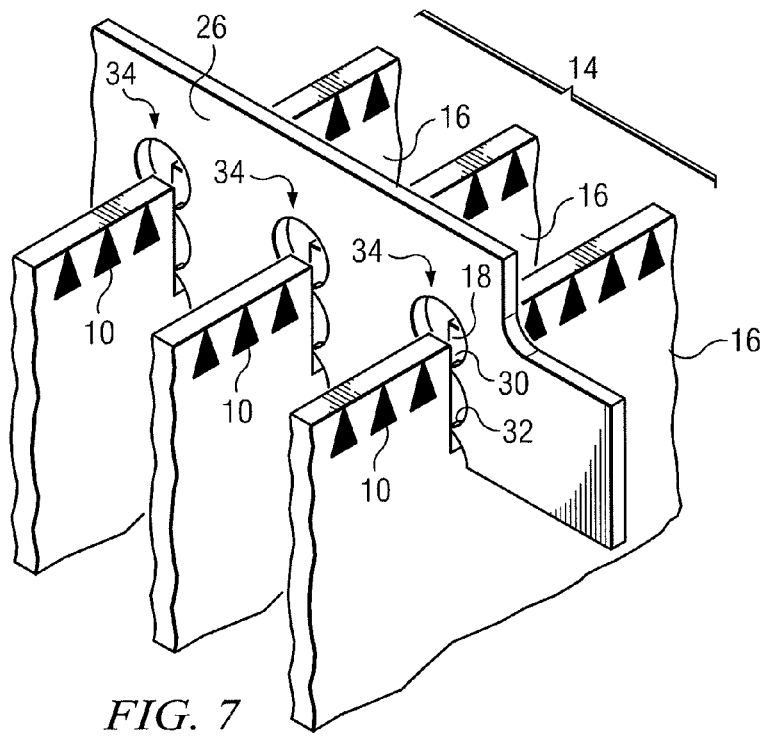
FIG. 7 illustrates a system for stabilizing an electronic array, in accordance with one embodiment, showing a stabilization bar partially positioned onto a radar array.

FIG. 7 depicts a system for stabilizing an electronic array, in accordance with one embodiment, showing a stabilization bar 26 partially positioned onto a radar array. In this example, radar array 14 is composed of radiating element assemblies 16 which are secured at the bottom edges of radiating element assemblies 16. Stabilization bar 26 is positioned on top of radar array 14 such that notches 18 of radiating element assemblies 16 are aligned with gaps 30 of stabilizing portions 34. Stabilization bar 26 is lowered into notches 18 such that contact points 32 of stabilizing portions 34 fit within notches 18. This may be accomplished by calibrating radius 28. As an example, in some embodiments the thickness of radiating element assembly 16 is 0.039 inches; in this example, radius 28 may be 0.034 inches which will cause gaps 30 to fit within notches 18.

Figure 8:
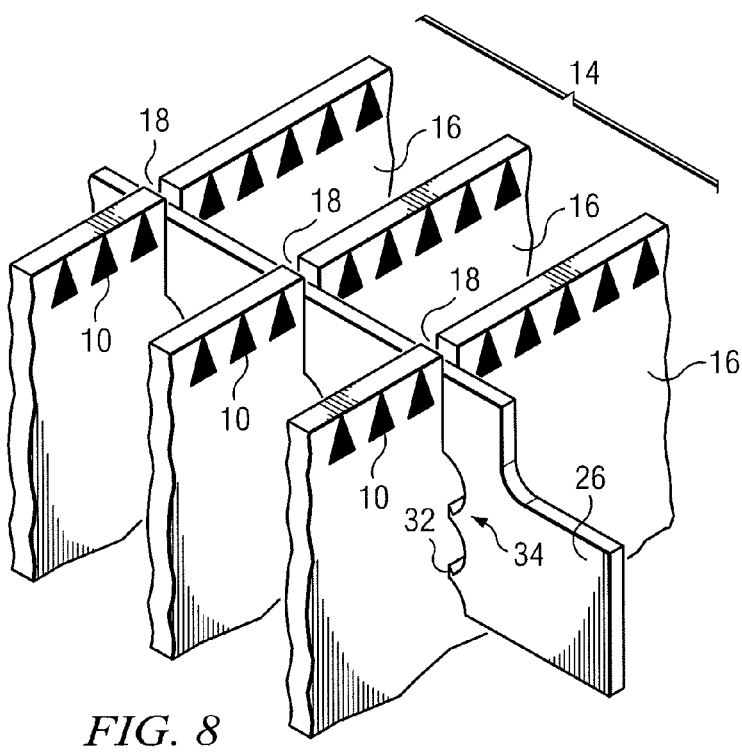
FIG. 8 illustrates the embodiment of FIG. 7 showing a stabilization bar fully installed onto a radar array.

FIG. 8 depicts one embodiment of a system for stabilizing an electronic array showing a stabilization bar fully installed onto a radar array. Stabilization bar 26 is lowered into notches 18 until the top of the highest edge of stabilizing portions 34 into stabilization bar 26 is in contact with the bottom edge of notch 18. When stabilization bar 26 is fully positioned, contact points 32 deform against radiating elements 16 to help stabilize the radiating elements; in one embodiment, there are four contact points 32 that deform against each radiating element assembly 16.

Figure 9:
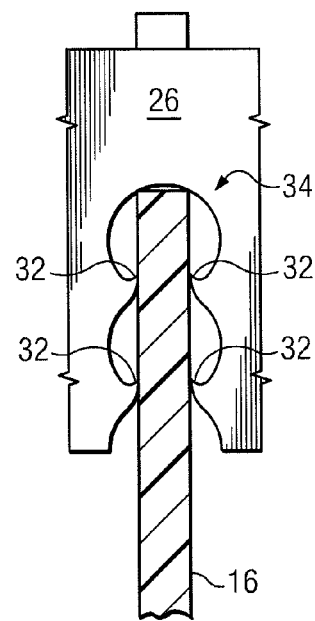
FIG. 9 is a side view of the embodiment illustrated in FIG. 8.

FIG. 9 is a side view of FIG. 8, displaying how contact points are deformed against a radiating element, in accordance with one embodiment. When contact points 32 are deformed against radiating element assembly 16, enough physical pressure may be exerted such that radiating element assemblies 16 will be prevented from being displaced within given tolerances. Stabilization bar 26 may be configured to meet more exacting stabilization requirements by simply reducing gap 30 which causes increased deformation and, as a result, increased stability.

An advantage present in this embodiment is that the functioning of stabilization bar 26 is relatively impervious to slight defects in the manufacture of either radiating element assembly 16 or stabilization bar 26 as compared to the configuration using comb strip 20. This is because the stabilization occurs through the deformation of contact points 32 against the sides of radiating element assemblies 16 rather than the tight fit between groove 22 and radiating element assembly 16; the latter requires a level of precision to be effective that is not required with stabilization bar 26. Consider, as an example only, a situation in which one radiating element assembly 16 out of radar array 14 has a defect such that it is slightly thicker than expected. When using a configuration that involves comb strip 20, groove 22 that corresponds with the irregular thickness of radiating element assembly 16 would have to be modified so as to fit the irregular thickness properly. On the other hand, stabilization bar 26 would not have to be modified in this situation because contact points 32 would still deform against the sides of radiating element assembly 16.

As an example only, consider a situation where stabilization bar 26 is placed on top of radar array 14 as illustrated in FIG. 8. In this example, assume that one of the radiating element assemblies 16 malfunctions and needs to be serviced. In order to access the malfunctioning unit, a technician merely needs to remove stabilization bar 26, service the component, then reinstall a new stabilization bar 26. In this example, stabilizing portions 34 is formed by drilling holes into stabilization bar 26; this makes replacing stabilization bar 26 inexpensive. This example illustrates how the complexity of gaining access to radar array 14 does not increase with the number of radiating element assemblies 16 since removal of stabilization bar 26 merely requires lifting it off of radar array 14.

Particular embodiments of a stabilization system for radar array 14 have been described. Use of stabilization bar 26 reduces manufacturing cost because of the ease in which contact points 32 may be created. Stabilization bar 26 also allows for easy access to radiating element assemblies 16 for servicing. Stabilization bar 26 is easily removed and, after servicing, is replaced by a new stabilization bar 26 to stabilize the array. Stabilization bar 26 may also be impervious to slight manufacturing defects within either stabilization bar 26 itself or radar array 14. Thus, the system provides cost-effective stabilization for an array.

Although several embodiments have been illustrated and described in detail, it will be recognized that modifications and substitutions are possible without departing from the spirit and scope of the appended claims.

What is claimed is:

1. A system for stabilizing an electronic array, comprising:
   at least one component having a notch;
   at least one stabilizing bar comprising at least two pairs of points, the at least one stabilizing bar positioned upon the at least one component such that the at least two pairs of points deform against the at least one component below the notch, the at least one stabilizing bar being plastic; and
   wherein each of two sides of the at least one component are contacted by more than one point of the at least one stabilizing bar.

2. The system of claim 1, wherein the at least two pairs of points are formed by drilling at least two substantially circular holes into the at least one stabilizing bar.

3. The system of claim 2, wherein at least one hole of the at least two holes has a diameter of between approximately 0.072 and 0.067 inches.

4. The system of claim 1, wherein the at least one stabilizing bar comprises G-10 laminate.

5. The system of claim 1, wherein the electronic array is a radar array.

6. The system of claim 1, wherein the at least one component comprises at least one radiating element.

7. The system of claim 1, wherein the notch comprises a width of approximately 0.020 inches.

8. The system of claim 1, wherein the at least one component comprises a thickness of between approximately 0.042 and 0.036 inches.

9. The system of claim 1, wherein a distance between each point of the first pair of points is less than a thickness of the component at the notch.

10. A method for stabilizing an electronic array, the method comprising:
    providing at least one component having a notch; and
    positioning at least one stabilizing bar comprising at least two pairs of points upon the at least one component such that the at least two pairs of points deform against the at least one component below the notch and such that each of two sides of the at least one component are contacted by more than one point of the at least one stabilizing bar, the at least one stabilizing bar being plastic.

11. The method of claim 10, further comprising forming the at least two pairs of points by drilling at least two substantially circular holes into the at least one stabilizing bar.

12. The method of claim 11, wherein at least one hole of the at least two holes has a diameter of between approximately 0.072 and 0.067 inches.

13. The method of claim 10, wherein the at least one stabilizing bar comprises G-10 laminate.

14. The method of claim 10, wherein the electronic array is a radar array.

15. The method of claim 10, wherein the at least one component comprises at least one radiating element.

16. The method of claim 10, wherein the notch comprises a width of approximately 0.02 inches.

17. The method of claim 10, wherein the at least one component comprises a thickness of between approximately 0.042 and 0.036 inches.

18. A system for stabilizing an electronic array, comprising:
- a plurality of radiating elements, each having at least two notches;
- at least two stabilizing bars, each having at least two sets of contact points, each set of contact points comprising at least two pairs of points, the at least two stabilizing bars being plastic; and
- the at least two stabilizing bars positioned upon the plurality of radiating elements such that the sets of contact points deform against the plurality of radiating elements below the notches; and
- wherein each of two sides of each radiating element is contacted by more than one point of each stabilizing bar.

19. The system of claim 18, wherein each set of contact points is formed by drilling at two substantially circular holes into each stabilizing bar of the at least two stabilizing bars.

* * * * *